(12) United States Patent
Haba et al.

(10) Patent No.: US 12,199,011 B2
(45) Date of Patent: Jan. 14, 2025

(54) EMBEDDED LIQUID COOLING

(71) Applicant: Adeia Semiconductor Bonding Technologies Inc., San Jose, CA (US)

(72) Inventors: Belgacem Haba, Saratoga, CA (US); Gaius Gillman Fountain, Jr., Youngsville, NC (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/399,127

(22) Filed: Dec. 28, 2023

(65) Prior Publication Data
US 2024/0222222 A1 Jul. 4, 2024

Related U.S. Application Data

(60) Provisional application No. 63/478,148, filed on Dec. 31, 2022.

(51) Int. Cl.
| | |
|---|---|
| *H01L 23/433* | (2006.01) |
| *H01L 23/00* | (2006.01) |
| *H01L 25/065* | (2023.01) |

(52) U.S. Cl.
CPC .......... *H01L 23/433* (2013.01); *H01L 24/08* (2013.01); *H01L 25/0652* (2013.01);
(Continued)

(58) Field of Classification Search
CPC .................................................. H01L 23/473
See application file for complete search history.

(56) References Cited

U.S. PATENT DOCUMENTS

| | | | |
|---|---|---|---|
| 4,274,479 A | 6/1981 | Eastman | |
| 5,309,986 A | 5/1994 | Itoh | |

(Continued)

FOREIGN PATENT DOCUMENTS

| | | |
|---|---|---|
| CN | 109524373 A | 3/2019 |
| CN | 111128976 B | 10/2021 |

(Continued)

OTHER PUBLICATIONS

Evan G. Colgan, "A Practical Implementation Of Silicon Microchannel Coolers", available online at <https://www.electronics-cooling.com/2007/11/a-practical-implementation-of-silicon-microchannel-coolers/>, Nov. 1, 2007, 10 pages.

(Continued)

*Primary Examiner* — David A Zarneke
(74) *Attorney, Agent, or Firm* — HALEY GUILIANO LLP

(57) ABSTRACT

A device package may include a package substrate, a package cover disposed on the package substrate, and an integrated cooling assembly disposed between the package substrate and the package cover. The package cover generally has an inlet opening and an outlet opening disposed there through. The integrated cooling assembly includes a semiconductor device and a cold plate attached to the semiconductor device. The device package may include a material layer between the package cover and the cold plate. The cold plate may include a patterned first side and an opposite second side. The patterned first side may include a base surface and sidewalls extending downward from the base surface, where the base surface is spaced apart from the semiconductor device to collectively define a coolant channel. Here, the coolant channel is in fluid communication with the inlet opening and the outlet opening through (Continued)

openings disposed through respective portions of the material layer.

21 Claims, 13 Drawing Sheets

(52) U.S. Cl.
CPC .......... *H01L 25/0657* (2013.01); *H01L 24/16* (2013.01); *H01L 24/32* (2013.01); *H01L 24/73* (2013.01); *H01L 24/80* (2013.01); *H01L 2224/08225* (2013.01); *H01L 2224/16225* (2013.01); *H01L 2224/32225* (2013.01); *H01L 2224/73204* (2013.01); *H01L 2224/80895* (2013.01); *H01L 2224/80896* (2013.01); *H01L 2225/06517* (2013.01); *H01L 2225/06541* (2013.01); *H01L 2225/06582* (2013.01); *H01L 2225/06589* (2013.01); *H01L 2924/16151* (2013.01); *H01L 2924/16196* (2013.01); *H01L 2924/16235* (2013.01); *H01L 2924/16251* (2013.01)

(56) References Cited

U.S. PATENT DOCUMENTS

| | | |
|---|---|---|
| 5,522,452 A | 6/1996 | Mizuno et al. |
| 5,769,154 A | 6/1998 | Adkins et al. |
| 6,056,044 A | 5/2000 | Benson et al. |
| 6,351,384 B1 | 2/2002 | Daikoku et al. |
| 6,686,532 B1 | 2/2004 | Macris |
| 6,822,326 B2 | 11/2004 | Enquist et al. |
| 7,289,326 B2 | 10/2007 | Heydari et al. |
| 7,485,957 B2 | 2/2009 | Brandenburg et al. |
| 7,511,372 B2 | 3/2009 | Chiu |
| 7,523,617 B2 | 4/2009 | Venkatasubramanian et al. |
| 7,622,324 B2 | 11/2009 | Enquist et al. |
| 7,692,926 B2 | 4/2010 | Henderson et al. |
| 7,957,137 B2 | 6/2011 | Prasher |
| 7,978,473 B2 | 7/2011 | Campbell et al. |
| 7,997,087 B2 | 8/2011 | Venkatasubramanian et al. |
| 8,164,169 B2 | 4/2012 | Chrysler et al. |
| 8,630,091 B2 | 1/2014 | Ward et al. |
| 9,224,673 B2 | 12/2015 | Chen et al. |
| 9,299,641 B2 | 3/2016 | Sekar et al. |
| 9,355,932 B2 | 5/2016 | Ankireddi et al. |
| 9,391,143 B2 | 7/2016 | Tong et al. |
| 9,553,071 B1 | 1/2017 | Haba |
| 9,741,638 B2 | 8/2017 | Hsieh et al. |
| 9,741,696 B2 | 8/2017 | Katkar et al. |
| 9,746,248 B2 | 8/2017 | Semenov et al. |
| 9,768,149 B2 | 9/2017 | Vadhavkar et al. |
| 9,818,723 B2 | 11/2017 | Haba |
| 10,032,695 B2 | 7/2018 | Iyengar et al. |
| 10,083,934 B2 | 9/2018 | Haba |
| 10,157,818 B2 | 12/2018 | Chen et al. |
| 10,170,392 B2 | 1/2019 | Chainer et al. |
| 10,199,356 B2 | 2/2019 | Kinsley |
| 10,312,221 B1 | 6/2019 | Agarwal et al. |
| 10,332,823 B2 | 6/2019 | Chen et al. |
| 10,461,059 B2 | 10/2019 | Koopmans et al. |
| 10,694,641 B2 | 6/2020 | Basu et al. |
| 10,978,427 B2 | 4/2021 | Li et al. |
| 11,187,469 B2 | 11/2021 | Karesh |
| 11,387,164 B2 | 7/2022 | Wu et al. |
| 11,598,594 B2 | 3/2023 | Lewis et al. |
| 11,996,351 B2 | 5/2024 | Hsiao et al. |
| 2003/0157782 A1 | 8/2003 | Kellar et al. |
| 2004/0184237 A1 | 9/2004 | Chang |
| 2004/0251530 A1 | 12/2004 | Yamaji |
| 2005/0126766 A1 | 6/2005 | Lee et al. |
| 2005/0213301 A1 | 9/2005 | Prasher |
| 2006/0042825 A1 | 3/2006 | Lu et al. |
| 2006/0103011 A1 | 5/2006 | Andry et al. |
| 2007/0025082 A1 | 2/2007 | Lee et al. |
| 2007/0107875 A1 | 5/2007 | Lee et al. |
| 2008/0096320 A1 | 4/2008 | Farrar |
| 2009/0122491 A1 | 5/2009 | Martin et al. |
| 2010/0116534 A1 | 5/2010 | Choi et al. |
| 2010/0230805 A1 | 9/2010 | Refai-Ahmed |
| 2010/0300202 A1 | 12/2010 | Joyce |
| 2011/0129986 A1 | 6/2011 | Libralesso et al. |
| 2013/0044431 A1 | 2/2013 | Koeneman |
| 2013/0050944 A1 | 2/2013 | Shepard |
| 2013/0087904 A1 | 4/2013 | Clark et al. |
| 2014/0126150 A1 | 5/2014 | Song et al. |
| 2015/0194363 A1 | 7/2015 | Jun et al. |
| 2016/0276314 A1 | 9/2016 | Ching et al. |
| 2017/0012016 A1 | 1/2017 | Joshi et al. |
| 2017/0092565 A1 | 3/2017 | Chen et al. |
| 2017/0103937 A1 | 4/2017 | Hsieh et al. |
| 2018/0053730 A1 | 2/2018 | Shao et al. |
| 2018/0087842 A1 | 3/2018 | Chainer et al. |
| 2018/0090427 A1 | 3/2018 | Bernstein et al. |
| 2018/0160565 A1 | 6/2018 | Parida |
| 2018/0211900 A1 | 7/2018 | Gutala et al. |
| 2018/0308783 A1 | 10/2018 | Refai-Ahmed et al. |
| 2019/0008071 A1 | 1/2019 | Kim |
| 2019/0355706 A1 | 11/2019 | Enquist et al. |
| 2019/0385928 A1 | 12/2019 | Leobandung |
| 2020/0035583 A1 | 1/2020 | Beauchemin et al. |
| 2020/0105639 A1 | 4/2020 | Valavala et al. |
| 2020/0312742 A1 | 10/2020 | Lofgreen et al. |
| 2020/0343160 A1 | 10/2020 | Mizerak et al. |
| 2020/0350233 A1 | 11/2020 | Mizerak et al. |
| 2020/0352053 A1 | 11/2020 | Mizerak et al. |
| 2020/0395313 A1 | 12/2020 | Mallik et al. |
| 2021/0066164 A1 | 3/2021 | Wu et al. |
| 2021/0175143 A1 | 6/2021 | Yu et al. |
| 2021/0183741 A1 | 6/2021 | Jha et al. |
| 2021/0193548 A1 | 6/2021 | Wan et al. |
| 2021/0193620 A1 | 6/2021 | Refai-Ahmed et al. |
| 2021/0280497 A1 | 9/2021 | Brun et al. |
| 2021/0288037 A1 | 9/2021 | Tao et al. |
| 2021/0378106 A1 | 12/2021 | Iyengar et al. |
| 2021/0378139 A1 | 12/2021 | Rice et al. |
| 2021/0410329 A1 | 12/2021 | Yang et al. |
| 2022/0037231 A1 | 2/2022 | Hsiao et al. |
| 2022/0087059 A1 | 3/2022 | Sathyamurthy et al. |
| 2022/0117115 A1 | 4/2022 | Malouin et al. |
| 2022/0130734 A1 | 4/2022 | Chiu et al. |
| 2022/0189850 A1 | 6/2022 | Liff et al. |
| 2022/0210949 A1 | 6/2022 | Edmunds et al. |
| 2022/0230937 A1 | 7/2022 | Malouin et al. |
| 2022/0408592 A1 | 12/2022 | Malouin et al. |
| 2023/0048500 A1 | 2/2023 | Malouin et al. |
| 2023/0154828 A1 | 5/2023 | Haba et al. |
| 2023/0156959 A1 | 5/2023 | Malouin et al. |
| 2023/0207474 A1 | 6/2023 | Uzoh et al. |
| 2023/0245950 A1 | 8/2023 | Haba et al. |
| 2023/0284421 A1 | 9/2023 | Malouin et al. |
| 2023/0298969 A1 | 9/2023 | Park et al. |
| 2024/0038633 A1 | 2/2024 | Haba et al. |
| 2024/0203823 A1 | 6/2024 | Uzoh et al. |
| 2024/0222226 A1 | 7/2024 | Haba |
| 2024/0249995 A1 | 7/2024 | Haba |
| 2024/0249998 A1 | 7/2024 | Gao et al. |
| 2024/0266255 A1 | 8/2024 | Haba et al. |

FOREIGN PATENT DOCUMENTS

| | | |
|---|---|---|
| CN | 115719735 A | 2/2023 |
| JP | 2000-340727 A | 12/2000 |
| KR | 10-1049508 B1 | 7/2011 |
| KR | 10-2023-0136509 A | 9/2023 |
| TW | 200834871 A | 8/2008 |
| WO | 2013097146 A1 | 7/2013 |

OTHER PUBLICATIONS

Francisco Pires, "TSMC Exploring On-Chip, Semiconductor-Integrated Watercooling", tom's Hardware, retrieved from https://

(56) References Cited

OTHER PUBLICATIONS www.tomshardware.com/news/tsmc-exploring-on-chip-semiconductor-integrated-watercooling, Jul. 13, 2021, 23 pages.
IBM, "Functional electronic packaging-Thermal management roadmap", available online at <https://web.archive.org/web/20170220095511/https://www.zurich.ibm.com/st/electronicpackaging/cooling.html>, Feb. 20, 2017, 7 pages.
International Search Report and Written Opinion received for PCT Patent Application No. PCT/US23/28942, mailed on Nov. 16, 2023, 12 pages.
International Search Report and Written Opinion received for PCT Patent Application No. PCT/US23/84874, mailed on Apr. 22, 2024, 7 pages.
International Search Report and Written Opinion received for PCT Patent Application No. PCT/US23/85801, mailed on Apr. 26, 2024, 8 pages.
International Search Report and Written Opinion received for PCT Patent Application No. PCT/US23/85816, mailed on Apr. 23, 2024, 11 pages.
International Search Report and Written Opinion received for PCT Patent Application No. PCT/US23/86233, mailed on Apr. 26, 2024, 7 pages.
Kaplan, F., et al., "LoCool: Fighting Hot Spots Locally for Improving System Energy Efficiency", IEEE Transactions on Computer-Aided Design of Integrated Circuits and Systems, vol. 39, No. 4, Apr. 2020, pp. 895-908.
Patent Application S/N U.S. Appl. No. 18/129,567, filed Mar. 31, 2023, First Name Inventor: Cyprian Emeka Uzoh, "Embedded Cooling Systems for Device Packages and Methods of Cooling Packaged Devices".
PCT Application No. PCT/US2024/022253, International Search Report and Written Opinion dated Jul. 17, 2024, 14 pages.
Shamsa, M., et al., "Thermal conductivity of diamond-like carbon films", Applied Physics Letters, vol. 89, No. 16, Oct. 20, 2006, pp. 161921-161921-3.
Wu, C. J., et al., "Ultra High Power Cooling Solution for 3D-Ics", 2021 Symposium on VLSI Technology, Jun. 2021, 2 pages.
Benson D.A. et al., "Micro-Machined Heat Pipes in Silicon MCM Substrates", Sandia National Laboratories, Sandia Report: SAND97-0100-UC-704, printed Jan. 1997, 17 pages.
Colgan, Evan G., "A practical implementation of silicon microchannel coolers," Electronics Cooling, Nov. 1, 2007, http://www.electronics-cooling.com/2007/11/a-practical-implementation-of-silicon-microchannel-coolers, printed May 23, 2023, 11 pages.
Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.
"KoolMicro Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.
"Microconvective Liquid Cooling for high power electronics," https://jetcool.com/technology/, downloaded Mar. 7, 2024, 6 pages.
"Single-Phase Direct-to-Chip Liquid Cooling," 6 pages, downloaded from https://jetcool.com/post/single-phase-direct-to-chip-liquid-cooling-microconvective-vs-microchannel-liquid-cooled-cold-plates/ on Mar. 7, 2024.
Walsh, Stephen Michael, "Microjet Impingement Cooling of High Power-Density Electronics," Thesis, submitted May 11, 2018, 93 pages.
International Search Report and Written Opinion mailed Mar. 16, 2023, in International Application No. PCT/US2022/050105, 9 pages.
International Search Report and Written Opinion mailed May 30, 2023, in International Application No. PCT/US2023/061494, 9 pages.
International Search Report and Written Opinion mailed Jun. 5, 2024, in International Application No. PCT/US2024/013758, 9 pages.
Lien, Yu-Jen, et al., "An Energy-efficient Si-integrated Micro-cooler for High Power and Power-density Computing Applications", 2024 IEEE 74th ECTC, 5 pages.

EMBEDDED LIQUID COOLING

CROSS-REFERENCE TO RELATED APPLICATIONS

This application claims priority to U.S. Provisional Application 63/478,148, filed on Dec. 31, 2022, which is herein incorporated by reference in its entirety.

FIELD

The present disclosure relates to advanced packaging for microelectronic devices, and in particular, embedded cooling systems for device packages and methods of manufacturing the same.

BACKGROUND

Energy consumption poses a critical challenge for the future of large-scale computing as the world's computing energy requirements are rising at a rate that most would consider unsustainable. Some models predict that the information and communications and technology (ICT) ecosystem could exceed 20% of global electricity use by 2030, with direct electrical consumption by large-scale computing centers accounting for more than one-third of that energy usage. Cooling costs make up a significant portion of computing center energy requirements as even small increases in operating temperatures can negatively impact the performance of microprocessors, memory devices, and other electronic components.

Thermal dissipation in high-power density chips is also a critical challenge as improvements in chip performance, e.g., through increased gate density and multi-core microprocessors, have resulted in increased power density and a corresponding increase in thermal flux that contributes to elevated chip temperatures. These elevated temperatures are undesirable as they can degrade the chip's operating performance, efficiency, and reliability. Cooling systems used to maintain the chip at a desired operating temperature typically remove heat using one or more heat dissipation devices, e.g., thermal spreaders, heat pipes, cold pipes, and heat sinks, which are thermally coupled to the chip using a compliant thermally conductive material (TIM), e.g., thermal pastes, thermal adhesives, thermal gap fillers, etc. The thermal interface material maintains thermal contact with the surfaces of the chip and heat dissipation device(s) to facilitate heat transfer therebetween. Unfortunately, the combined thermal resistance of thermal interface materials and the thermal resistance at interfacial boundary regions inhibits heat transfer from the chip to the heat dissipation devices, undesirably reducing the cooling efficiency of the cooling system.

Accordingly, there exists a need in the art for improved energy-efficient cooling systems and methods of manufacturing the same.

SUMMARY

Embodiments herein provide integrated device cooling assemblies embedded in advanced device packages. Advantageously, the integrated device cooling assemblies shorten the thermal resistance path between devices and coolant fluids and reduce thermal communication between devices disposed in the same package.

In one implementation, an integrated cooling assembly includes a semiconductor device and a cold plate bonded to the semiconductor device. The cold plate includes a the patterned first side having a base surface, sidewalls, and a plurality of support features. The base surface is spaced apart from the semiconductor device to collectively define a coolant channel therebetween. The sidewalls slope away from the base surface at an angle greater than 90 degrees and are bonded to the device to define a perimeter of the coolant channel. The plurality of support features are bonded to the device inward of the perimeter, and each of the plurality of support features are wider at the base surface than at a bonding interface with the device.

BRIEF DESCRIPTION OF THE DRAWINGS

The above and other objects and advantages of the disclosure will be apparent upon consideration of the following detailed description, taken in conjunction with the accompanying drawings, in which.

Figure 1A:
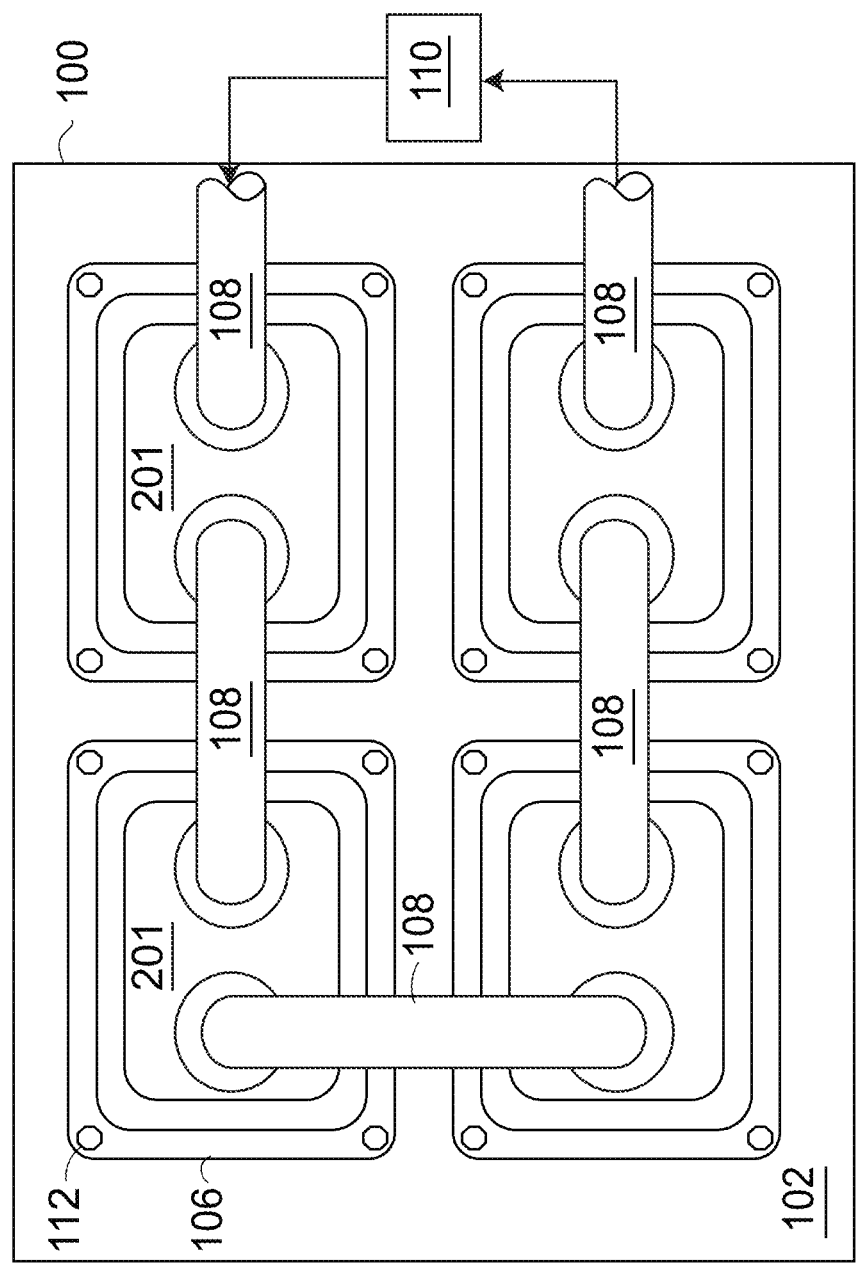
FIG. 1A is a schematic plan view of an example of a system panel, in accordance with embodiments of the disclosure.

The figures herein depict various embodiments of the invention for purposes of illustration only. It will be appreciated that additional or alternative structures, assemblies, systems, and methods may be implemented within the principles set out by the present disclosure.

DETAILED DESCRIPTION

Embodiments herein provide for integrated cooling assemblies embedded within a device package. The integrated cooling assemblies provide for direct thermal transfer between a semiconductor device and a coolant fluid flowing As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed. The term substrate also includes "semiconductor substrates" that provide a supporting material upon which elements of a semiconductor device are fabricated or attached, and any material layers, features, and/or electronic devices formed thereon, therein, or therethrough.

As described below, the semiconductor substrates herein generally have a "device side," e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that form the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active" and "non-active sides" are also used to describe surfaces of material layers or features formed on, in, or through the semiconductor substrate, whether or not the material layers or features are ultimately present in the fabricated or assembled device.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower," and the like are generally made with reference to the X, Y, and Z directions set forth in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," either alone or in combination with a spatially relevant term include both relationships with intervening elements and direct relationships where there are no intervening elements.

Unless otherwise noted, the term "cold plate" generally refers to a base plate, or a stack of base plates directly bonded to one another, which may be bonded to the semiconductor device. The cold plate may include material layers and/or metal features formed on or in a surface of the base plate or stack of base plates that facilitate direct dielectric or hybrid bonding with a semiconductor device. The term "integrated cooling assembly" generally refers to a cold plate attached to a semiconductor device that are attached so as to form a single piece, such as by use of the direct bonding methods described below. The direct bonding methods enable heat from the semiconductor device to be transferred through the cold plate to a coolant fluid flowed thereover without the use of a thermal interface material. Unless otherwise noted, the device packages and cold plates described herein may be used with any desired fluid coolant, e.g., liquid, gas, and/or vapor-phase coolants. Thus, the terms should not be construed as limiting the coolant to any one fluid phase.

FIG. 1A is a schematic plan view of an example of a system panel 100, in accordance with embodiments of the disclosure. Generally, the system panel 100 includes a printed circuit board, here PCB 102, a plurality of device packages 201 mounted to the PCB 102, and a plurality of coolant lines 108 fluidly coupling each of the device packages 201 and to a coolant source 110. It is contemplated that coolant may be delivered to each of the device packages 201 in any desired fluid phase, e.g., liquid, vapor, gas, or combinations thereof and may flow out from the device package 201 in the same phase or a different phase. In some embodiments the coolant is delivered to the device package 201 and returned therefrom as a liquid and the coolant source 110 may comprise a heat exchanger or chiller to maintain the coolant at a desired temperature. In other embodiments, the coolant may be delivered to the device packages 201 as a liquid, vaporized to a liquid within the device package, and returned to the coolant source 110 as a vapor. In those embodiments, the device packages 201 may be fluidly coupled to the coolant source 110 in parallel and the coolant source 110 may include or further include a compressor (not shown) for condensing the received vapor to a liquid form.

Figure 1B:
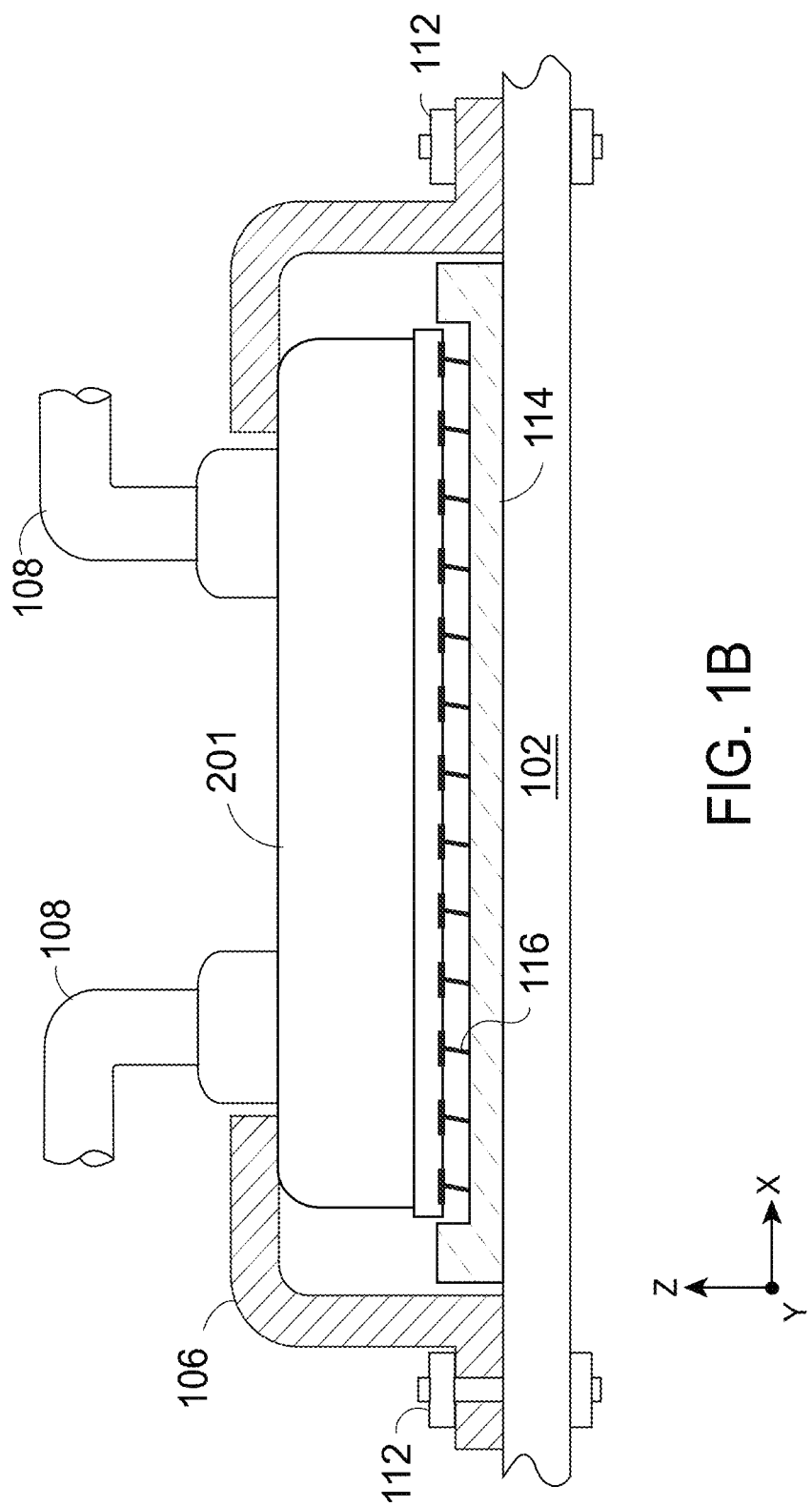
FIG. 1B is a schematic partial sectional side view of a device package mounted on a PCB, in accordance with embodiments of the disclosure.

FIG. 1B is a schematic partial sectional side view of a portion of the system panel 100 of FIG. 1. As shown, each device package 201 is disposed in a socket 114 of the PCB 102 and connected thereto using a plurality of pins 116, or by other suitable connection methods, such as solder bumps (not shown). The device package 201 may be seated in the socket 204 and secured to the PCB 102 using a mounting frame 106 and a plurality of fasteners 112, e.g., compression screws, collectively configured to exert a relatively uniform downward force on the upward facing edges of the device package 201. The uniform downward force ensures proper pin contact between the device package 201 and the socket 204.

Figure 2A:
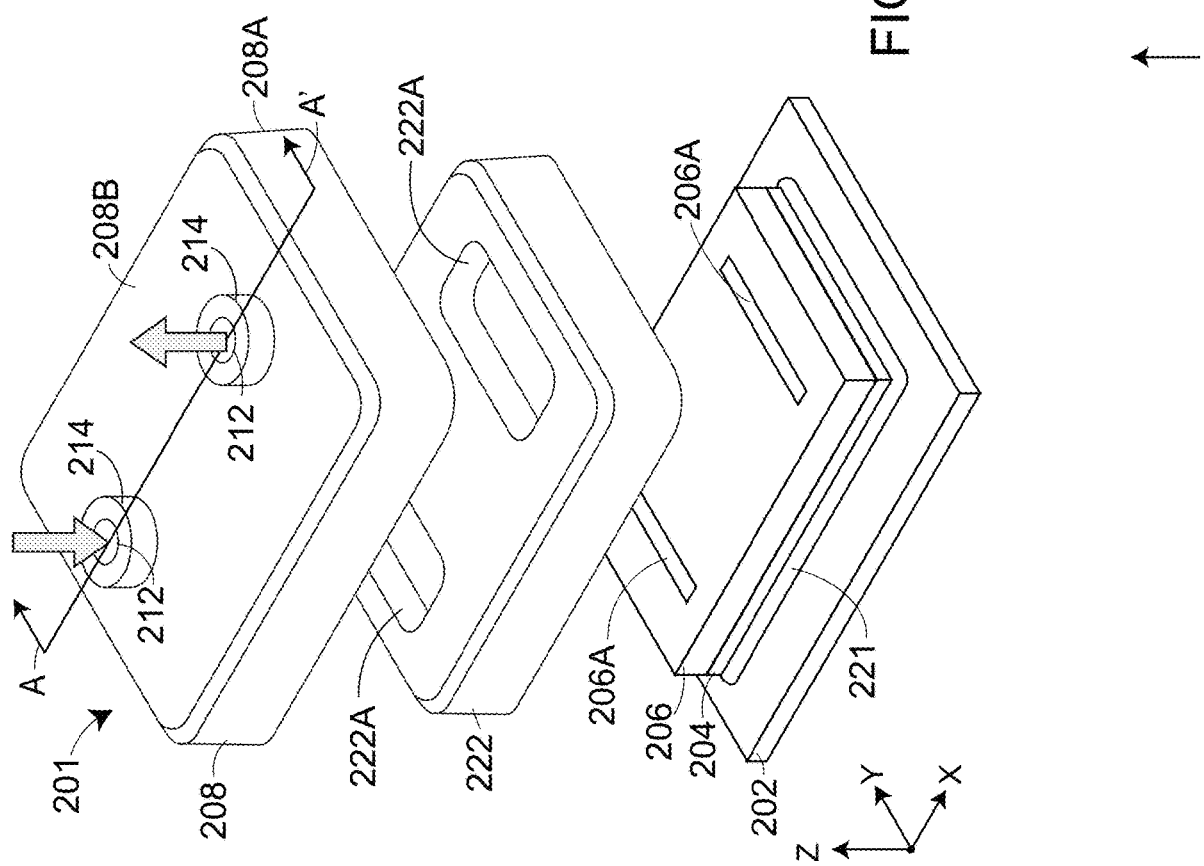
FIG. 2A is a schematic exploded isometric view of the device package in FIG. 1B.
Figure 2B:
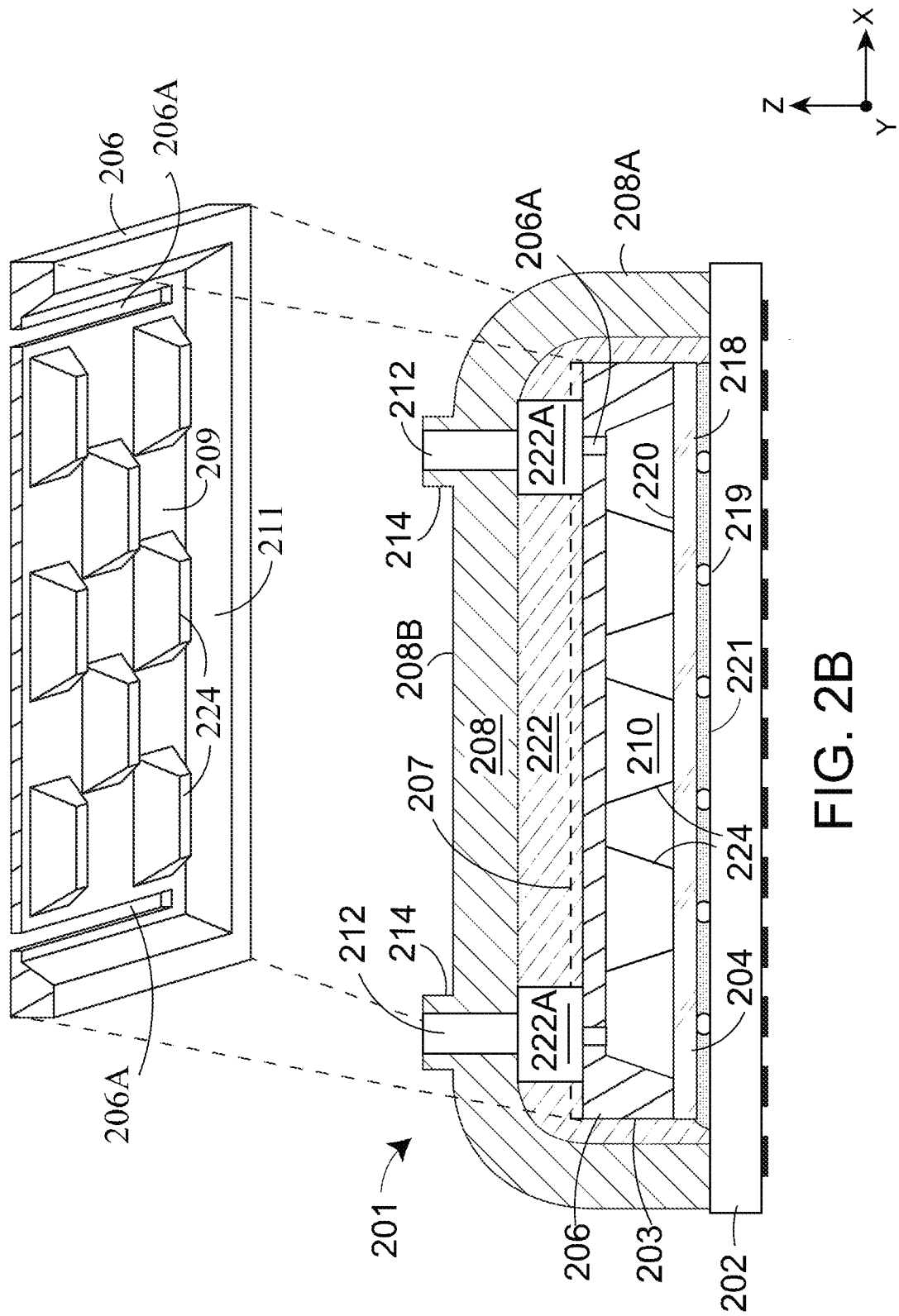
FIG. 2B is a schematic sectional view of the device package of FIG. 1B.

FIG. 2A is a schematic exploded isometric view of an example device package 201, in accordance with embodiments of the disclosure. FIG. 2B is a schematic sectional view of the device package 201 taken along line A-A' of FIG. 2A. Generally, the device package 201 includes a package substrate 202, an integrated cooling assembly 203 disposed on the package substrate 202, and a package cover 208 disposed on a peripheral portion of the package substrate 202. The package cover 208 extends over the integrated cooling assembly 203 so that the integrated cooling assembly 203 is disposed between the package substrate 202 and the package cover 208. As shown, the device package 201 further includes a sealing material layer 222 that forms a coolant impermeable barrier between the package cover 208 to the integrated cooling assembly 203. Coolant is delivered to the integrated cooling assembly 203 via inlet/outlet openings 212 in the package cover 208 and corresponding openings 222A formed through the sealing material layer 222. In some embodiments, the device package 201 may further include a support member 207 attached to the integrated cooling assembly 203.

Generally, the package substrate 202 includes a rigid material, such as an epoxy or resin-based laminate, that supports the integrated cooling assembly 203 and the package cover 208. The package substrate 202 may include conductive features disposed in or on the rigid material that electrically couple the integrated cooling assembly 203 to a system panel, such as the PCB 102.

The integrated cooling assembly 203 typically includes a semiconductor device, here device 204, and a cold plate 206 bonded to the device 204. Here, the device 204 includes an active side 218 that includes device components, e.g., transistors, resistors, and capacitors, formed thereon or therein, and a non-active side, here the device backside 220, opposite the active side 218. As shown, the active side 218 is positioned adjacent to and facing towards the package substrate 202. The active side 218 may be electrically connected to the package substrate 202 by use of conductive bumps 219, which are encapsulated by a first underfill layer 221 disposed between the device 204 and the package substrate 202. The first underfill layer 221 may comprise a cured polymer resin or epoxy, which provides mechanical support to the conductive bumps 219 and protects against thermal fatigue.

The cold plate 206 generally includes a patterned side that faces towards the device 204 and an opposite side that faces towards the package cover 208. The patterned side includes a device facing cavity comprising a base surface 209, sidewalls 211 that surround the base surface 209, and a plurality of support features 224 disposed inwardly of the sidewalls 311. When attached to the device 204 disposed therebelow the sidewalls 211 form a perimeter of the coolant channel 210, the base surface 209 forms an uppermost surface of the coolant channel 210, and the device backside 220 forms the bottom of the coolant channel 210. Thus, the device backside 220 is direct thermal contact with coolant flowed therethrough. Generally, the support features 224 extend from the base surface 209 to a bonding interface with the device backside 220. The support features 224 provide structural support to the integrated cooling assembly 303 and disrupt laminar fluid flow at the interface of the coolant and the device backside 220 resulting in increased heat transfer therebetween.

Here, coolant is circulated through the coolant channel 210 through openings disposed through the cold plate 206, shown here as openings 206A disposed between the downwardly facing base surface 209 and an opposite upwardly facing surface. The openings 206A are in fluid communication with the inlet/outlet openings 212 of the package cover 208 through openings 222A formed in the sealing material layer 222 disposed therebetween.

As described in the methods below, the cold plate 206 may be patterned using an anisotropic etch process that causes surfaces of the sidewalls and the protruding features 234 to slope, i.e., to form an angle of less than 90° with the bonding surface of the device 204. The anisotropic etch process causes the protruding features 224 to have a trapezoidal shape in cross section where each of the protruding features 224 is wider at the base surface 209 than at its interface with the device 204. Similarly, the sidewalls slope away from the base surface 209 and are wider at their base than at the interface with the device 204.

The sloped surface desirably increase the stability of the sidewalls 211 and protruding features 224 during manufacturing of the integrated cooling assembly 203. The added stability allows for the width of the field surfaces of the sidewalls 211 to be narrower, and the coolant channels to be deeper, when compared to cold plates having orthogonal surfaces, as narrow features at the base may undesirably buckle and break as the aspect ratio (height to width ratio) thereof is increased.

Here, the cold plate 206 is attached to the device backside 220 without the use of an intervening adhesive material, e.g., the cold plate 206 may be directly bonded to the device backside 220, such that the cold plate 206 and the device backside 220 are in direct thermal contact. The package cover 208 generally comprises one or more vertical or sloped sidewall portions 208A and a lateral portion 208B that spans and connects the sidewall portions 208A. The sidewall portions 208A extend upwardly from a peripheral surface of the package substrate 202 to surround the device 204 and the cold plate 206 disposed thereon. The lateral portion 208B is disposed over the cold plate 206 and is typically spaced apart from the cold plate 206 by a gap corresponding to the thickness of the sealing material layer 222. Coolant is circulated through the coolant channel 210 through the inlet/outlet openings 212 formed through the lateral portion 208B. In each of the embodiments described herein, coolant lines 108 may be attached to the device package 201 by use of connector features formed in the package cover 208, such as threads formed in the sidewalls of the inlet/outlet openings 212 and/or protruding features 214 that surround the openings 212 and extend upwardly from a surface of the lateral portion 208B.

Typically, the package cover 208 is formed of semi-rigid or rigid material so that at least a portion of the downward force exerted on the package cover 208 by the mounting frame 106 (FIG. 2) is transferred to the supporting surface of the package substrate 202 and not transferred to the cold plate 206 and the device 204 therebelow. In some embodiments, the package cover 208 is formed of a thermally conductive metal, such as aluminum or copper. In some embodiments, the package cover 208 functions as a heat spreader that redistributes heat from one or more electronic components within a multi-component device package, such as described below.

The sealing material layer 222 forms an impermeable barrier between the integrated cooling assembly 203 and the package cover 208 that prevents coolant from reaching the active side 218 of the device 204 and causing damage thereto. In some embodiments, the sealing material layer 222 comprises a polymer or epoxy material that extends upwardly from the package substrate 202 to encapsulate and/or surround at least a portion of the device 204. In other embodiments, the sealing material layer 222 may be disposed between only the upward facing surface of the cold plate 206 and the portion of the package cover 208 disposed thereover. In some embodiments, the sealing material layer is formed from a molding compound, e.g., a thermoset resin, that when polymerized, forms a hermetic seal between the package cover 208 and the cold plate 206. Here, coolant is delivered to the cold plate 206 through openings 222A disposed through the sealing material layer 222. As shown, the openings 222A are respectively in registration and fluid communication with the inlet/outlet openings 212 of the package cover 208 thereabove and the inlet/outlet openings 206A in the cold plate 206 therebelow. Typically, coolant lines 108 are attached to the device package 201 by use of connector features formed in the package cover 208, such as threads formed in the sidewalls of the inlet/outlet openings 212 and/or protruding features 214 that surround the inlet/outlet openings 212 and extend upwardly from the surface of the lateral portion 208B.

Beneficially, the sealing material layer 222 provides mechanical support that improves system reliability and extends the useful lifetime of the device package 201. For example, the second sealing material layer 222 may reduce mechanical stresses that can weaken interfacial bonds and/or electrical connections between electrical components of the device package 201, such as stresses caused by vibrations, mechanical and thermal shocks, and/or fatigue caused by repeated thermal cycles. In some embodiments, the sealing material layer 222 may be a thermally conductive material, such as a polymer or epoxy having one or more thermally conductive additives, such as silver and/or graphite. In some embodiments, the device package 201 further includes a support member 207 attached to the upward-facing side of the cold plate 206, the support member 207 may be formed of a rigid material, e.g., a metal or ceramic plate, that provides mechanical support to the cold plate 206. The support member 207 may be attached to the cold plate 206 using a direct bonding method or by use of an intervening adhesive layer (not shown).

Figure 3A:
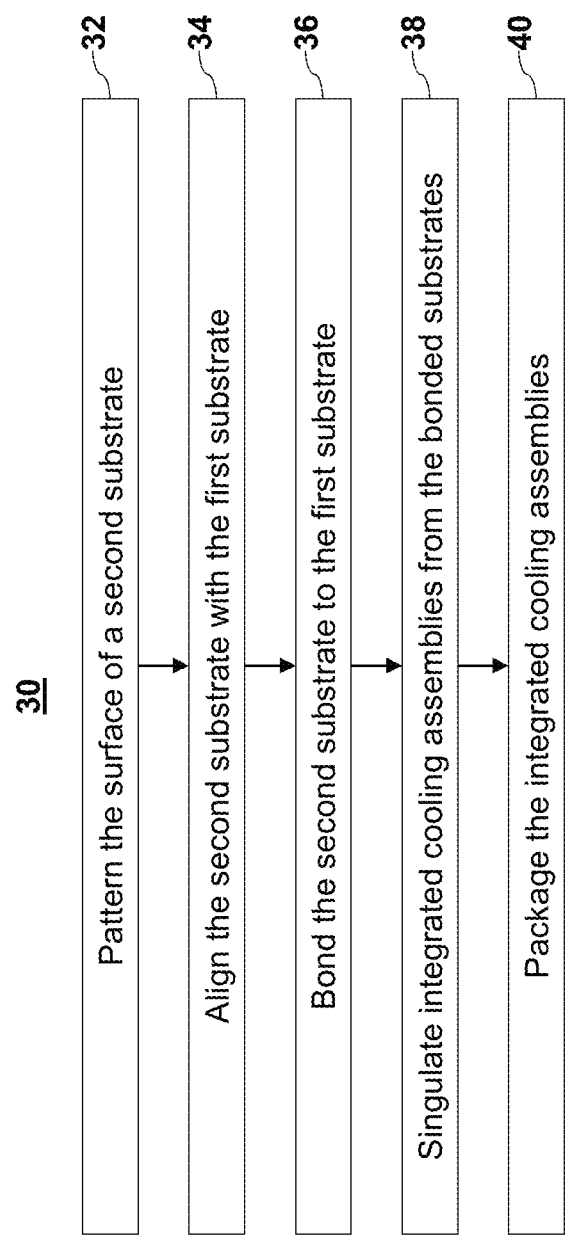
FIG. 3A shows a method that can be used to manufacture the integrated cooling assemblies described herein.
Figure 3B:
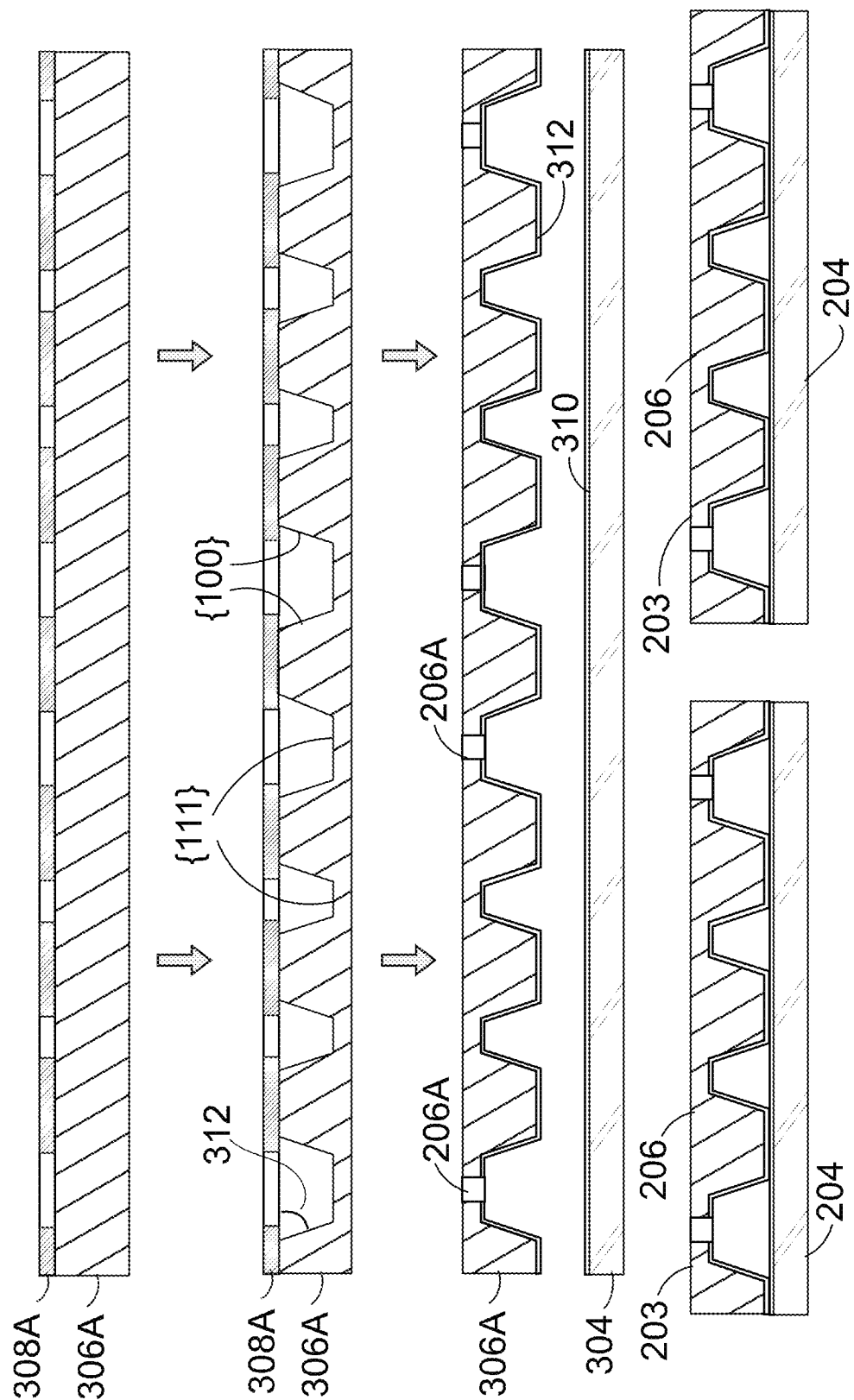
FIG. 3B shows an integrated cooling assembly at different stages of manufacturing to illustrate aspects of the method in FIG. 3A.

FIG. 3A is a flow diagram setting forth a method 30 of forming an integrated cooling assembly, according to embodiments of the disclosure. FIG. 3B schematically illustrates the integrated cooling assembly 203 at various stages of the method 300. Generally, the method includes bonding a first substrate 304 comprising a plurality of devices 304 to a second substrate 306 comprising a plurality of cold plates 206, and singulating a plurality of cold plate assemblies 303 from the bonded substrates.

At block 32, the method 30 includes patterning the surface of the second substrate 306A, e.g., a monocrystalline silicon wafer, using a patterned mask layer 308A formed on a surface of the second substrate 306A. The anisotropic etch process uses inherently differing etch rates for the silicon material as between {100} plane surfaces and {111} plane surfaces when exposed to an anisotropic etchant.

In some embodiments, the etching process is controlled to where the etch rates of the {111} plane surfaces and the {100} plane surfaces have a ratio between about 1:10 and about 1:200, such as between about 1:10 and about 1:100, for example between about 1:10 and 1:50, or between about 1:25 and 1:75. Examples of suitable anisotropic wet etchants include aqueous solutions of potassium hydroxide (KOH), ethylene diamine and pyrocatechol (EPD), ammonium hydroxide (HN4OH), hydrazine (N2H4), or tetra methyl ammonium hydroxide (TMAH). The actual differing etch rates of the silicon substrate into {100} plane surfaces and {111} plane surfaces depend on the concentration of the etchant in the aqueous solution, the temperature of the aqueous solution, and a concentration of the dopant in the substrate (if any).

Typically, a {100} plane at the surface of monocrystalline silicon substrate will meet the {111} plane in the bulk of the substrate to form an angle 312 of 54.74°. Thus, in some embodiments, the surfaces of the sidewalls and the protruding features, when formed in a monocrystalline silicon substrate, may form an angle with a plane of the field surface of the substrate (or the device 304 bonded thereto) of about 54.74°.

Typically, the mask layer 308A is formed of a material which is selective to anisotropic etch compared to the underlying monocrystalline silicon substrate. Examples of suitable mask materials include silicon oxide (SixOy) or silicon nitride (SixNy). In some embodiments, the mask layer 308A has a thickness of about 100 nm or less, such as about 50 nm or less, or about 30 nm or less. The mask layer 308A may be patterned using any suitable combination of lithography and material etching patterning methods.

At block 34, the method 30 includes aligning the first substrate 304 with a second substrate 306A, where the first substrate 304 includes a plurality of to-be-singulated die, e.g., devices 204, and the second substrate 306 includes a plurality of to-be-singulated cold plates 206.

The first substrate 304 may include a bulk material, and a plurality of material layers disposed on the bulk material. The bulk material may include any semiconductor material suitable for manufacturing semiconductor devices, such as silicon, silicon germanium, germanium, group III-V semiconductor materials, group II-VI semiconductor materials, or combinations thereof. For example, in some embodiments, the first substrate 304 may include a monocrystalline wafer, such as a silicon wafer, a plurality of device components formed in or on the silicon wafer, and a plurality of interconnect layers formed over the plurality of device components. In other embodiments, the substrate may comprise a reconstituted substrate, e.g., a substrate formed from a plurality of singulated devices embedded in a support material.

The bulk material of the first substrate 304 may be thinned after the devices 204 are formed using one or more backgrind, etching, and polishing operations that remove material from the backside. Thinning the first substrate 304 may include using a combination of grinding and etching processes to reduce the thickness (in the Z-direction) to about 450 um or less, such as about 201 um or less, or about 150 um or less. After thinning, the backside may be polished to a desired smoothness using a chemical mechanical polishing (CMP) process, and the dielectric material layer may be deposited thereon. In some embodiments, the dielectric material layer may be polished to a desired smoothness to prepare the first substrate 304 for the bonding process. In some embodiments, the method 30 includes forming the plurality of metal features in the dielectric material layer in preparation for a hybrid bonding process, such as by use of a damascene process.

In some embodiments, the active side is temporarily bonded to a carrier substrate (not shown) before or after the thinning process. When used, the carrier substrate provides support for the thinning operation and/or for the thinned material to facilitate substrate handling during one or more of the subsequent manufacturing operations described herein.

At block 36, the method 30 includes directly bonding the patterned second substrate 306A to the first substrate 304. Here, the method 30 may include forming dielectric layers 310, 312 on the first substrate 304 and second substrate 306A, and directly bonding the first and second substrates 304, 306A includes forming dielectric bonds between the first dielectric layer 310 and the second dielectric material layer 312.

Generally, directly bonding the surfaces (of the dielectric material layers) includes preparing, aligning, and contacting the surfaces. Preparing the surfaces may include smoothing the respective surfaces to a desired surface roughness, such as between 0.1 to 3.0 nm RMS, activating the surfaces to weaken or open chemical bonds in the dielectric material, and terminating the surfaces with a desired species. Smoothing the surfaces may include polishing the substrates 304, 306A using a chemical mechanical polishing (CMP) process. Activating and terminating the surfaces with a desired species may include exposing the surfaces to radical species formed in a plasma.

In some embodiments, the plasma is formed using a nitrogen-containing gas, e.g., $N_2$, and the terminating species includes nitrogen and hydrogen. In some embodiments, the surfaces may be activated using a wet cleaning process, e.g., by exposing the surfaces to an aqueous ammonia solution. In some embodiments, the dielectric bonds may be formed using a dielectric material layer deposited on only one of the substrates 304, 306A but not on both. In those embodiments, the direct dielectric bonds may be formed by contacting the deposited dielectric material layer of one substrate directly with a bulk material surface of the other substrate.

Directly forming direct dielectric bonds between the substrates at block 36 includes bringing the prepared and aligned surfaces into direct contact at a temperature less than 150° C., such as less than 100° C., for example, less than 30° C., or about room temperature, e.g., between 20° C. and 30° C. Without intending to be bound by theory, it is believed that the hydrogen terminating species diffuse from the interfacial bonding surfaces, and chemical bonds are formed between the remaining nitrogen species during the direct bonding process. In some embodiments, the direct bond is strengthened using an anneal process, where the substrates are heated to and maintained at a temperature of greater than about 30° C. and less than about 450° C., for example, greater than about 50° C. and less than about 250° C., or about 150° ° C. for a duration of about 5 minutes or more, such as about 15 minutes. Typically, the bonds will strengthen over time even without the application of heat. Thus in some embodiments, the method does not include heating the substrates.

In embodiments where the substrates are bonded using hybrid dielectric and metal bonds, the method may further include planarizing or recessing the metal features below the field surface before contacting and bonding the dielectric material layers. After the dielectric bonds are formed, the substrates 304, 306A may be heated to a temperature of 150° C. or more and maintained at the elevated temperature for a duration of about 1 hour or more, such as between 8 and 24 hours, to form direct metallurgical bonds between the metal features. Suitable direct dielectric and hybrid bonding technologies that may be used to perform aspects of the methods described herein include ZiBond® and DBI®, each of which are commercially available from Adeia Holding Corp., San Jose, CA, USA.

At block 38, the method 30 includes singulating the integrated cooling assemblies 203 from the bonded substrates. Singulation after bonding imparts distinctive structural characteristics on the integrated cooling assemblies 203 as the bonding surface of each cold plate 206 has the same perimeter as the backside of the device 204 bonded thereto. Thus, the sidewalls of the cold plate 206 are typically flush with the edges of the device 204 about their common perimeters. In some embodiments, the cold plates 206 are singulated from the second substrate 306A using a process that cuts or divides the second substrate 306A in a vertical plane, i.e., parallel to the Z-direction. In those embodiments, the sides of the cold plate 206 are substantially perpendicular to the backside of the device, i.e., a horizontal (X-Y) plane of an attachment interface between the device 204 and the cold plate 206. In some embodiments, the cold plates 206 are singulated using a saw or laser dicing process.

At block 40, the method includes connecting the integrated cooling assembly to the package substrate 202 and sealing the package cover 208 to the integrated cooling assembly 203 by use of a molding compound that when cured, forms a sealing material layer 222. In some embodiments, the method further includes forming openings 222A in the sealing material layer 222.

Figure 3C:
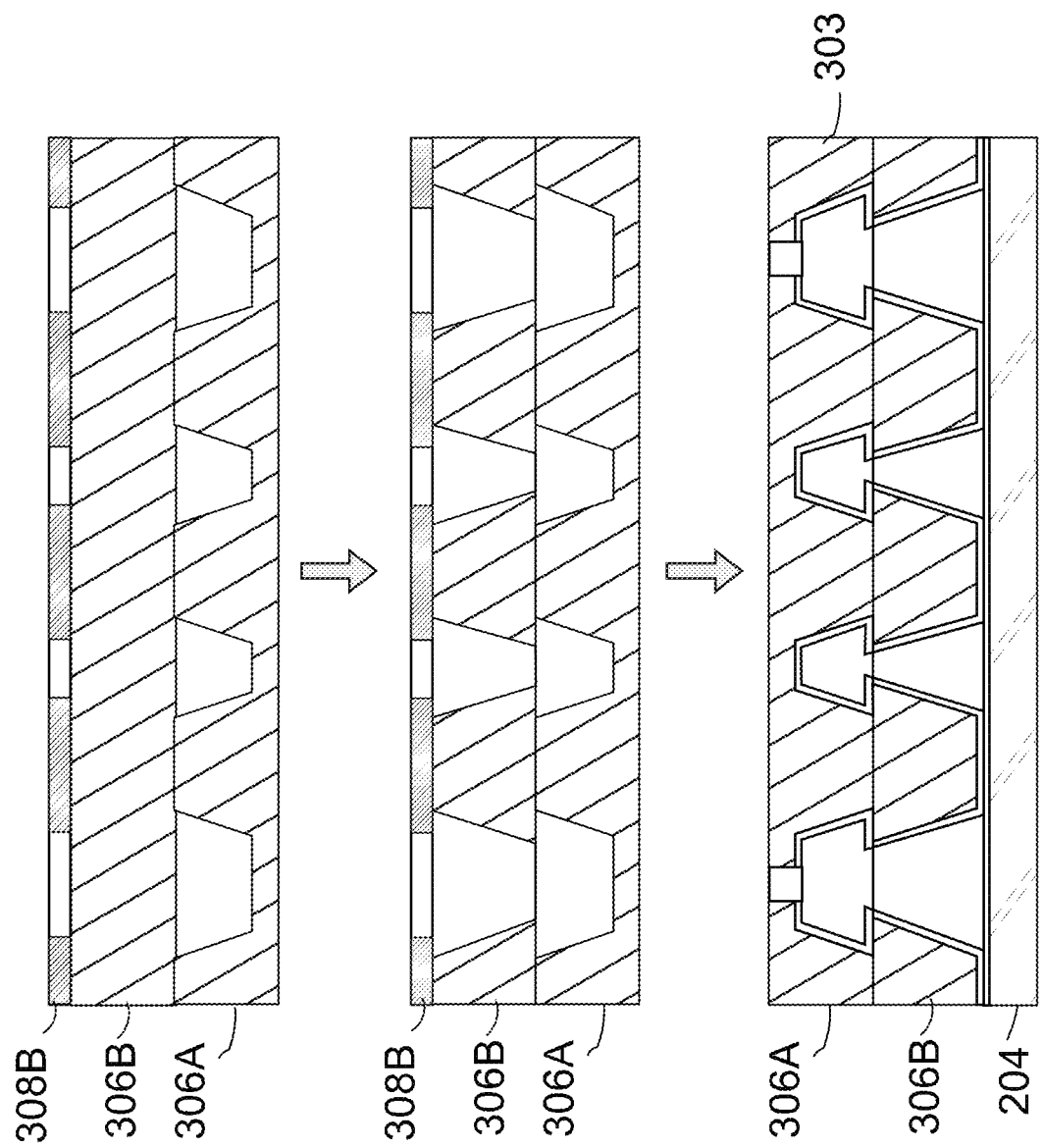
FIG. 3C shows an integrated cooling assembly at different stages of manufacturing to illustrate aspects of the method in FIG. 3A.
Figure 3D:
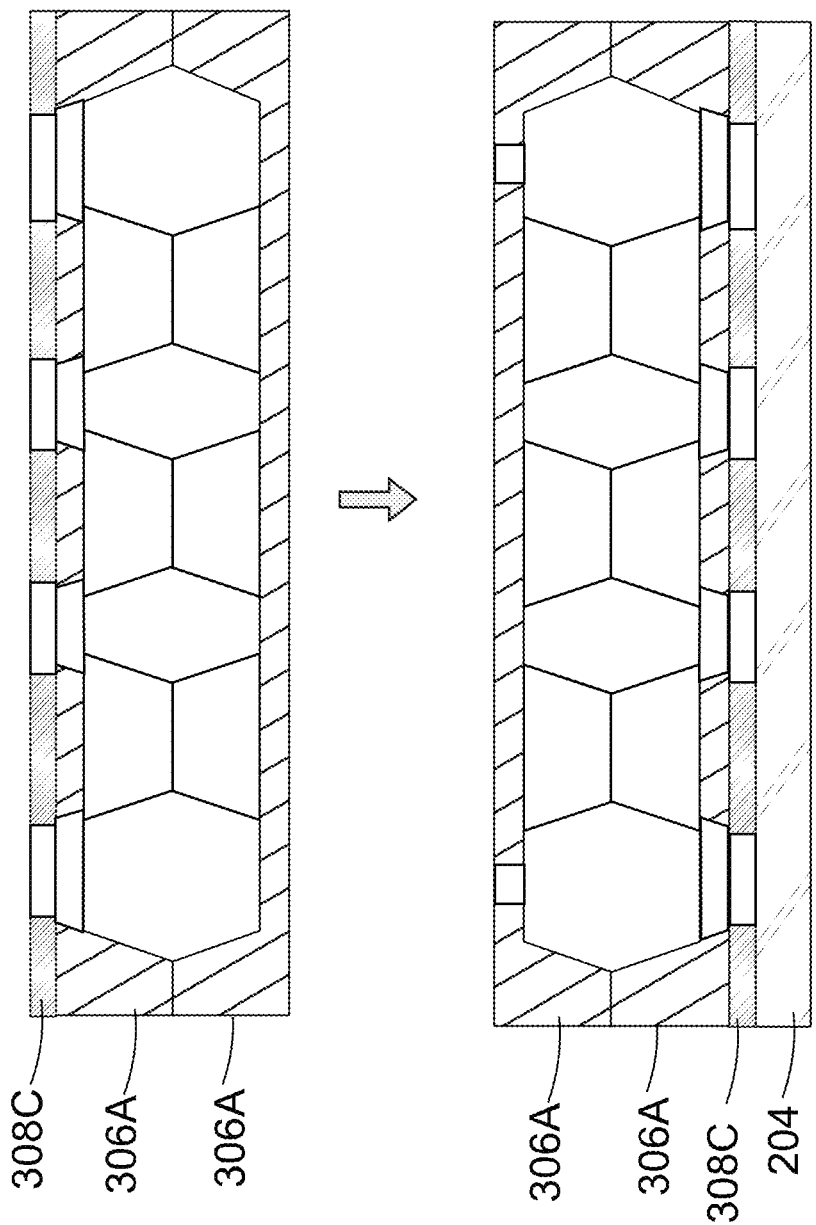
FIG. 3D shows an integrated cooling assembly at different stages of manufacturing to illustrate aspects of the method in FIG. 3A.

In other embodiments, the cold plate may be formed of two or more patterned substrates. For example, in FIG. 3C, the cold plate comprises a second substrate 306A patterned using the methods above and a third substrate 306B bonded to the patterned surface of the second substrate 306A. The third substrate 306B is patterned using a mask layer 308B, which may have the same or a different pattern than the mask layer 308A. Here, the third substrate 306B is anisotropically etched through the mask layer 308A to form openings that extend through to the patterned surface of the second substrate 306B. Thus, the resulting coolant channel has a depth that is greater than 2× the thickness of the coolant channel formed by a single substrate of the same thickness. For example, if the substrates comprise silicon wafers with a thickness of between 700 and 800 um, the depth of the coolant channel may be 1 mm or more, such as 1.2 mm or more, or 1.4 mm or more. In FIG. 3D, the cold plate comprises two of the second substrates 306A which have each been patterned and then bonded pattern surface to patterned surface. Openings are then formed through one of the second substrates 306B before bonding the substrate (with the openings formed therethrough) to the device 304, so that the device 304 will be exposed to the coolant through the openings formed in the second substrate.

It is contemplated that the methods above are not limited to crystalline silicon as sloped surfaces can be formed using other methods known to those skilled in the art. Thus, in some embodiments, the cold plates may be formed of a bulk material having a substantially similar coefficient of linear thermal expansion (CTE) to the bulk material of the device, where the CTE is a fractional change in length of the material (in the X-Y plane) per degree of temperature change. In some embodiments, the CTEs of the first and second substrates are matched so that the CTE of the second substrate 1006 is within about +/−20% or less of the CTE of the first substrate 1004, such as within +/−15% or less, within +/−10% or less, or within about +/−5% or less when measured across a desired temperature range. In some embodiments, the CTEs are matched across a temperature range from about −60° ° C. to about 100° C. or from about 60° C. to about 175° C. In one example embodiment, the matched CTE materials each include silicon. For example, the bulk material of the first substrate 1004 may include monocrystalline silicon, and the bulk material of the second substrate 1006 may include monocrystalline silicon or polycrystalline silicon. In some embodiments, the method 30 includes forming a dielectric material layer and, optionally, a plurality of metal features on the lower surface of the second substrate 306A.

Figure 4:
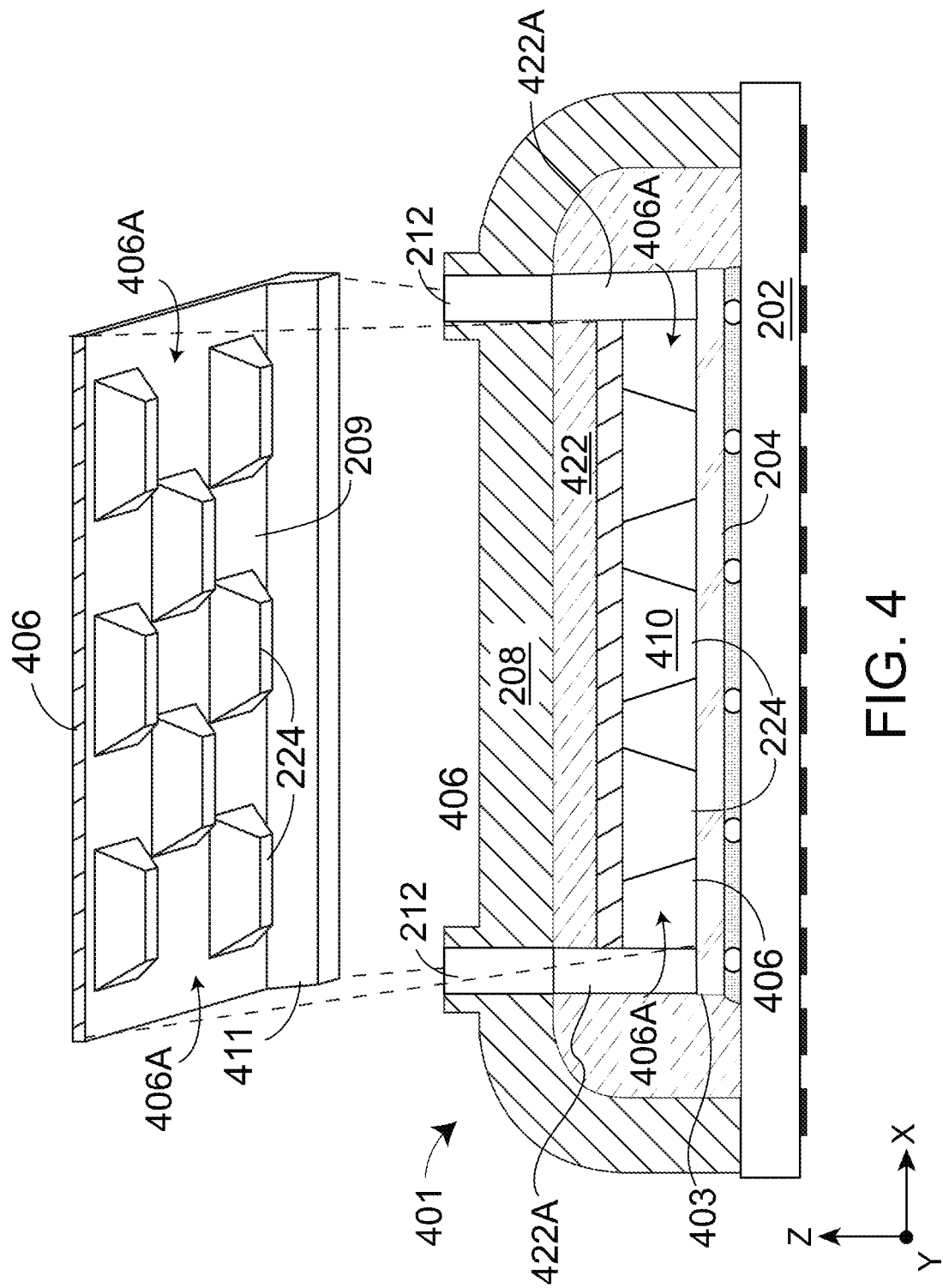
FIG. 4 is a schematic sectional view of a device package, in accordance with embodiments of the disclosure.

FIG. 4A is a schematic sectional view of device package 401, according to another embodiment, that may be used with the system panel 100. Here, the device package 401 includes a package substrate 202, a package cover 208, an integrated cooling assembly 403 disposed between the package substrate 202 and the package cover 208, and a sealing material layer 422 disposed between the integrated cooling assembly 403 and the package cover 208.

FIG. 4B is an exploded bottom up isometric view of the integrated cooling assembly 403 illustrated in FIG. 4A. The cooling assembly 403 generally includes a device 204 and a cold plate 406 attached to the backside of the device 204, e.g., by use of a direct bonding method described above. The cold plate 406 generally includes a patterned side that faces towards the device 204 and defines the upper portion of a coolant channel 410, and an opposite side that faces towards the package cover 208. Here, the patterned side forms a device-facing cavity comprising a base surface 409 and opposing sidewalls 411 that protrude downwardly from the base surface 409. When attached to the device 204 disposed therebelow, e.g., by direct bonding of the side surfaces 413 to the device backside 220, the sidewalls 411 define the sides of a coolant channel 410, the base surface 209 forms an uppermost surface of the coolant channel 410, and the device backside 220 forms a bottom surface the coolant channel 410. Here, coolant is circulated through the coolant channel 410 through openings 406A disposed on opposite ends of the cooling assembly 403.

As shown, the openings 406A each comprise a gap between the cooling assembly 403 and the device backside 220 disposed therebelow. The gap is formed at the ends of the cold plate 406 that do not include sidewalls (as shown) or that include sidewalls that only partially extend towards the backside of the device 204 and are not bonded thereto. The openings 406A are in fluid communication with the inlet/outlet openings 212 of the package cover 208 through openings 422A formed in the sealing material layer 422. As shown, the length cold plate 406 in the X direction is less than that of the device 204 and the openings 422A through the sealing material layer 422 extend from the package cover 208 to the end portions of the device backside disposed therebelow. In other embodiments, sidewalls 411 may have substantially the same length as the device 204, as shown in phantom, and the base surface 409 may have a length that is less than the length of the device 204. In either embodiment, the device backside 220 is in direct thermal contact with coolant circulated through the coolant channel 410 and with coolant entering and exiting the coolant channel 410 on either side of the openings 406A. It is contemplated that the cooling assembly 403 and sealing material layer 422 illustrated in FIGS. 4A-4B may be used with any of the device packages described herein.

Figure 5:
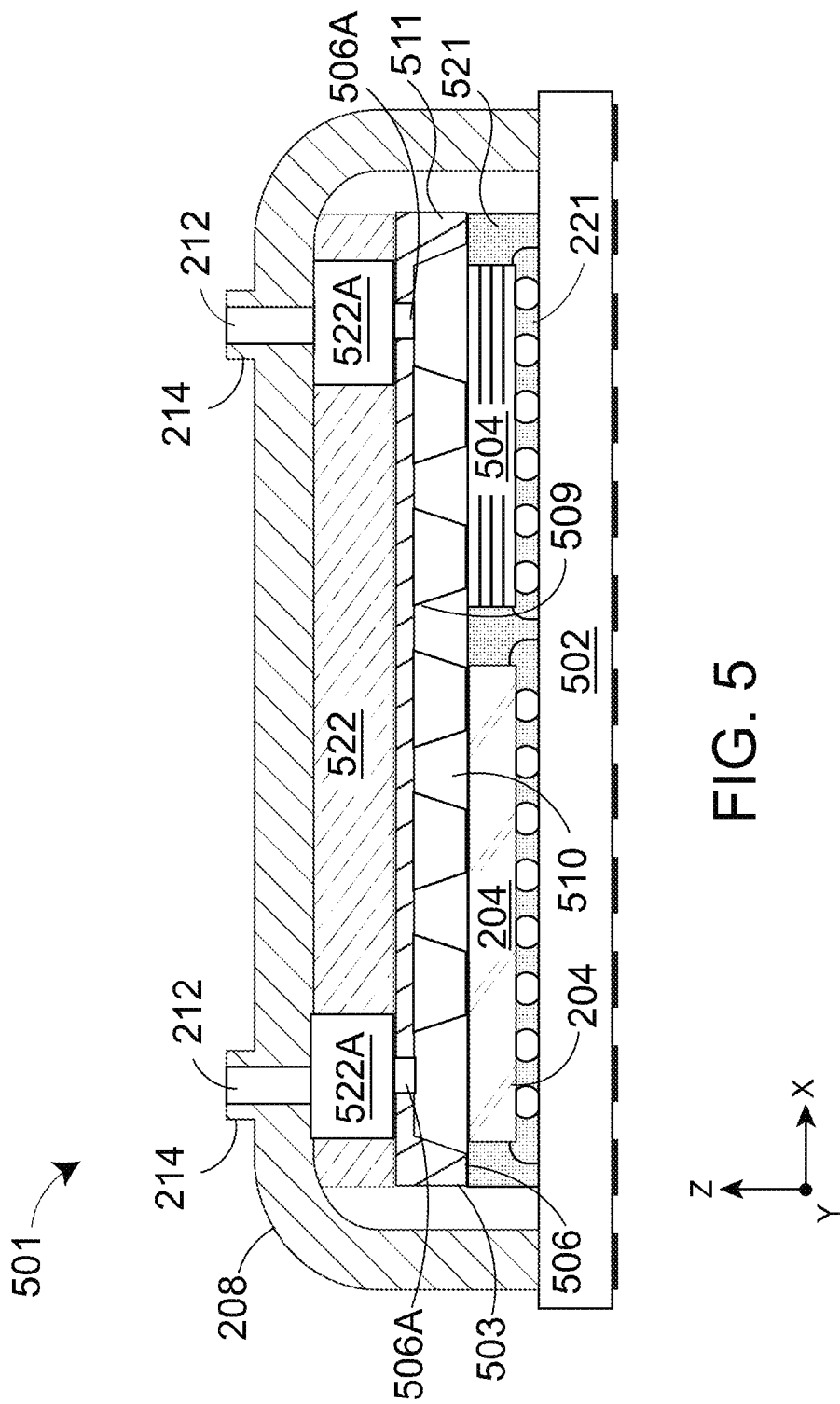
FIG. 5 is a schematic sectional view of a device package, in accordance with embodiments of the disclosure.

FIG. 5 is a schematic side sectional view of an example of a multi-component device package 501 that includes a cold plate 506 directly bonded to the backside surfaces of two or more devices. As shown, the device package 501 includes a package substrate 502, e.g., an interposer that facilitates communication between the device 204 and the device stack 504, an integrated cooling assembly 503, a package cover 208, and a sealing material layer 522. The integrated cooling assembly 503 may include a plurality of devices 204 (one shown) which may be singulated and/or disposed in a vertical device stack 504 (one shown), and a cold plate 206 attached to each of the devices 204 and device stacks 504, e.g., by the direct bonding methods described herein. In some embodiments, the device 204 may comprise a processor and the device stack 504 may comprise a plurality of memory devices. Here, the device 204 and the device stack 504 are disposed in a side-by-side arrangement on the package substrate 202 and are in electrical communication with one another through conductive elements formed in, on, or through the package substrate 502. Here, the cold plate 506 is sized to provide a bonding surface for attachment to both the device 204 and the device stack 504 but may otherwise be the same or substantially similar to other cold plates described herein. For example, here the cold plate 506 includes a patterned side comprising a base surface 509 and sidewalls 511 that extend downward from the base surface 509 to define a cavity. The cavity may be closed, e.g., surrounded by sidewalls 511, as shown, or may be open at either end as shown in FIGS. 4A-4B. The base surface 509 defines the uppermost surface of a coolant channel 510, and the sidewalls 511 may define the peripheral or the side boundaries of the coolant channel 510. Here, the device 204 and the device stack 504 define respective portions of the bottom of the coolant channel 510 and a second underfill layer 521 or other molding material disposed in the gap regions between the device 204 and the device stack 504 provide the intervening bottom portions of the coolant channel disposed between the device 204 and the device stack 504.

The sealing material layer 522, disposed between the cold plate 506 and package cover 208, attaches the cold plate 506 to the package cover 208 and forms a coolant-impermeable barrier therebetween. Coolant is circulated to the device package 501 through the inlet/outlet openings 212 of the package cover 208 and flows through the coolant channel 510 via openings 506A in the cooling assembly 503 and corresponding openings 522A formed through the sealing material layer 522. Here, the sealing material layer 522 may be formed of a polymer or epoxy molding material, such as described above, or a compliant adhesive layer, such as a TIM layer.

Figure 6:
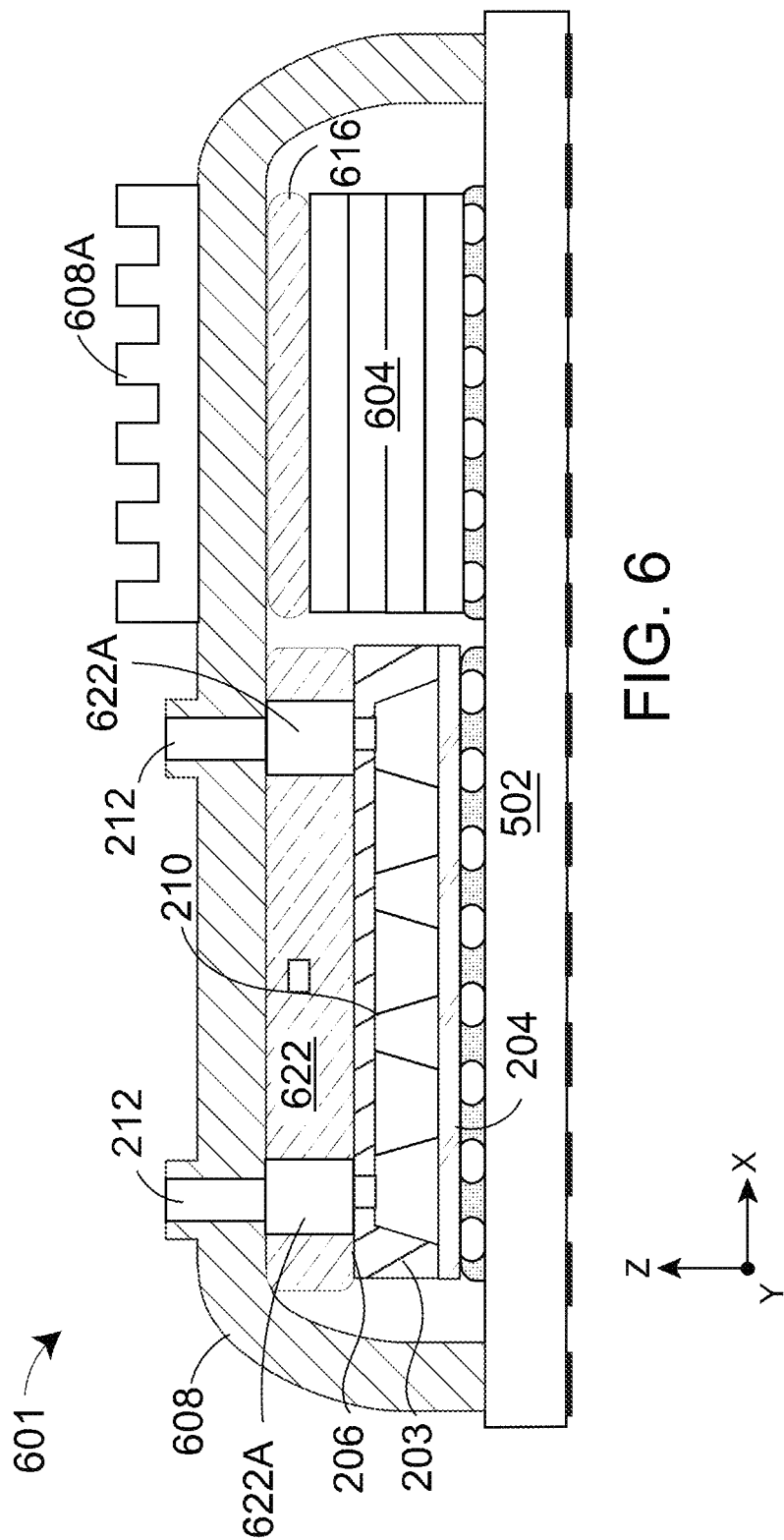
FIG. 6 is a schematic sectional view of a device package, in accordance with embodiments of the disclosure.

FIG. 6 is a schematic side sectional view of an example multi-component device package, according to an embodiment of the disclosure. Here, the device package 601 includes a package substrate 502, an integrated cooling assembly 203, one or more second devices (shown here as the device stack 604), and a package cover 608. The device package 601 further includes a sealing material layer 622, disposed between the integrated cooling assembly 203 and the portion of the package cover 608 disposed thereover. The sealing material layer 522 forms a coolant-impermeable barrier between the cold plate 206 and the package cover 208. Here, the device stack 604 is disposed on the package substrate 502 in a side-by-side arrangement with the device 204. Heat generated by the device 204 is dissipated to a coolant that is circulated through the coolant channel 210. Here, the coolant is circulated via inlet/outlet openings 212 in the package cover 608, openings 622A disposed through the sealing material layer 622 in registration and fluid communication with the inlet/outlet openings 212, and openings 206A in the cold plate 206 in fluid communication with the openings 622A.

The package cover 608 may be formed of a thermally conductive material and function as a thermal spreader. Beneficially, the cold plate 206 blocks a thermal pathway between the device 204 and the device stack 604 to prevent heat from transferring therebetween. Thus, heat generated by the device stack 604 may be dissipated to the coolant via the package cover 608 which is thermally coupled to the device stack 604 by use of a TIM layer 616. Thus, the device package 601 may be advantageously used to facilitate closely spaced devices on an interposer, such as high-power devices and memory stacks, to provide for reduced latency while simultaneously eliminating undesirable heat transfer therebetween. In some embodiments, the device package 601 further includes a heat sink 608A disposed on a portion of the package cover 608 above the device stack 604. The heat sink 608A may be thermally coupled to the package cover 608 by use of a TIM layer (not shown) or by direct bonding using the methods described herein.

Figure 7:
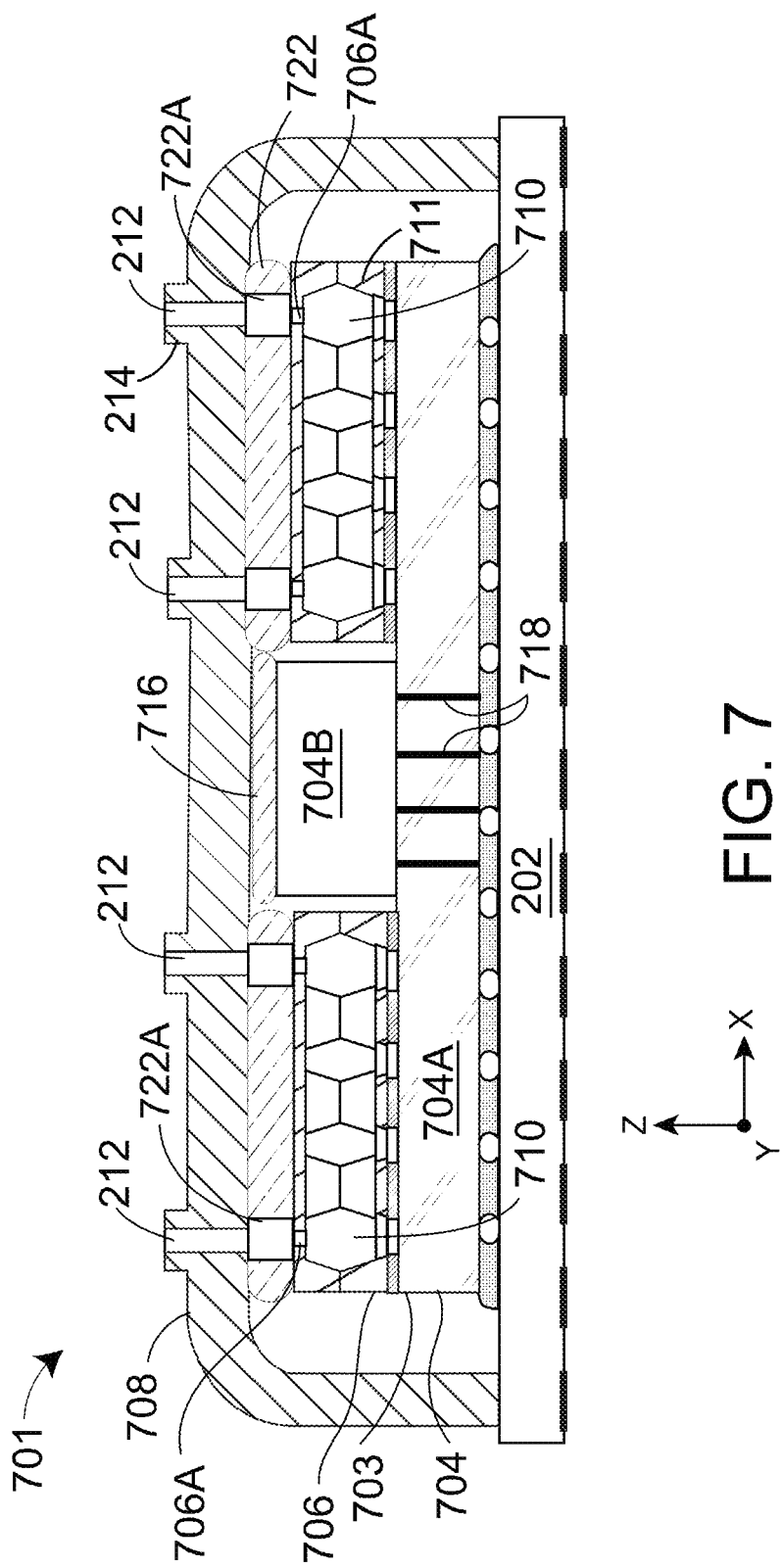
FIG. 7 is a schematic sectional view of a device package, in accordance with embodiments of the disclosure.

FIG. 7 is a schematic side section view of a 3DIC device package 701, according to an embodiment of the disclosure. Generally, the device package 701 includes an integrated cooling assembly 703 disposed on and electrically connected to the package substrate 202, a package cover 708 disposed over the integrated cooling assembly 703, and a sealing material layer 722 disposed between the cooling assembly 703 and the package cover 708. Here, the integrated cooling assembly 703 includes a 3DIC device 704, which includes a first device 704A, one or more second devices 704B (one shown), and one or more cold plates 706 (two shown). Here, the first device 704A is disposed facing towards the package substrate 202, i.e., active-side down, and the second device 704B is disposed on and bonded to a portion of a backside of the first device 704A. The package substrate 202 and the second device 704B and/or the first device 704A and the second device 704B may be interconnected using a plurality of through substrate vias (TSVs 718) disposed through the first device 704A, and hybrid bonds formed between the active side of the second device 704B and the backside of the first device 704A. In some embodiments, the one or more second devices 704B include a device stack, e.g., the device stack 604, directly bonded to and interconnected with the first device 704A using direct hybrid bonds.

Here, the first device 704A is cooled using the one or more cold plates 706 which are disposed on and bonded to the backside of the first device 704A in a side-by-side arrangement with the second device 704B. Each of the one or more cold plates 706 are attached to the package cover 708 using a sealing material layer 722, where the sealing material layer 722 forms a coolant impermeable barrier between the cold plate 706 and the package cover 708.

Here, each of the cold plates 706 includes a base surface 709 and sidewalls 711 extending downward from the base surface 709, where the sidewalls 711 are attached to the first device 704A, e.g., by use of a direct bonding method, to form a coolant channel 710 between the cold plate 706 and the portion of the first device 704A disposed therebelow. Heat generated by respective portions of the first device 704A is dissipated from the device package 701 via coolant flowing through the coolant channels 710. Here, the coolant is delivered to each of the coolant channels 710 through a flow path that includes inlet/outlet openings 212 in the package cover 708, openings 722A in the sealing material layers 722, and openings 706A in the cold plates 706.

Here, the second device 704B, is thermally coupled to the package cover 708 by use of a TIM layer 716 and the sealing material layers 722 and package cover 708 each comprise thermally conductive materials. Thus, heat generated by the second device 704B is transferred to the coolant in the coolant channels 710 via a heat transfer path that includes the TIM layer 716, the package cover 708, the sealing material layer 722, and the cold plates 706. In some embodiments, heat from the second device 704B is dissipated using a heat sink attached to the portion of the package cover 708 disposed over the second device 704B, such as the heat sink 608A described above.

In each of the embodiments described above, the sealing material layers and the openings disposed therethrough facilitate delivery of a coolant to an integrated device assembly without direct attachment of coolant lines thereto. Attachment of the coolant lines to the package cover reduces manufacturing complexity and costs as the package covers are typically formed from a less brittle material than that used to form the cold plates and thus are less prone to breakage.

Figure 8:
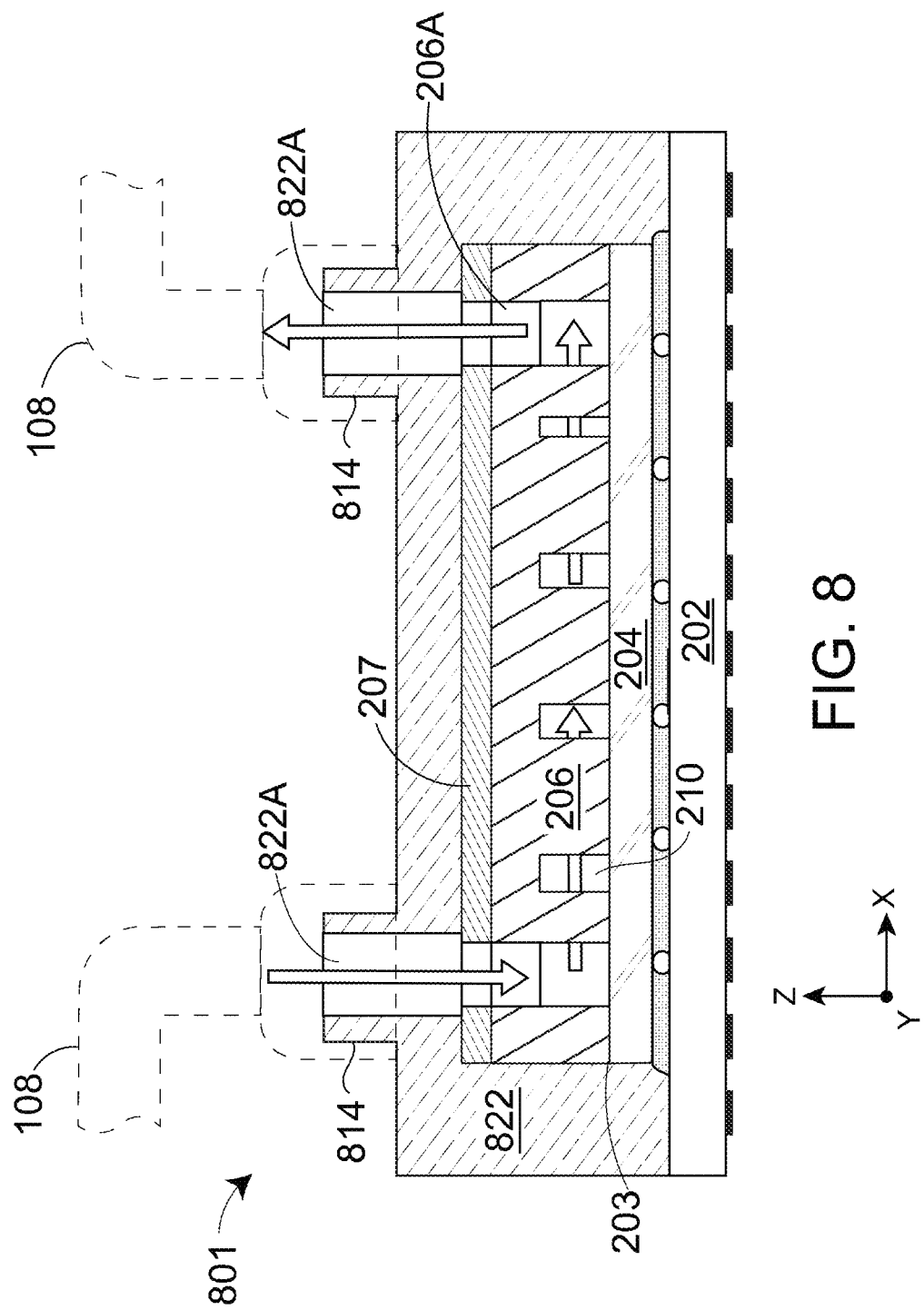
FIG. 8 is a schematic sectional view of a device package, in accordance with embodiments of the disclosure.

FIG. 8 is a schematic side section view of a device package 801, according to an embodiment of the disclosure. Here, the device package 801 includes a package substrate 202, a cooling assembly 203 disposed on the package substrate 202, and a material layer 822 disposed over and at least partially encapsulating the cooling assembly 203. The material layer 822 forms a coolant impermeable seal with the //cooling assembly 203 and may comprise a polymer or epoxy formed from a resin or molding compound. Coolant is delivered to the cooling assembly 203 and circulated therethrough via openings 822A disposed through the material layer 822B. Here, the material layer 822 includes one or more features 814, such as threads or protrusions that extend upwardly to surround each of the openings 822A, where the features 814 provide for the connection of coolant lines 108 (shown in phantom) directly to the material layer 822. In some embodiments, the device package 801 further includes a package cover (not shown) and the coolant lines are connected to the material layer 822 through openings disposed in the package cover.

The methods described above advantageously provide for embedded cold plates that eliminate and/or substantially reduce the thermal resistance pathway typically associated with cooling systems attached to the exterior of a device package. The cold plates may be attached to a semiconductor device using a direct dielectric or hybrid dielectric and metal bonding method. Such bonding methods allow for relatively low thermal budgets while providing substantially increased bonding strengths when compared to conventional silicon-to-silicon bonding methods, such as thermocompression bonding methods.

The cold plate and the semiconductor device may be formed of CTE matched materials which eliminate the need for an intervening TIM layer. In some embodiments, the integrated cooling assembly and the package cover may be formed of CTE mismatched materials and attached to one another using a flexible material to form the sealing material layer, or by use of a decoupling adhesive layer disposed between the sealing material layer and one of the cold plate or the package cover. The flexible material may absorb the difference in linear expansion between the package cover and the cold plate during repeated thermal cycles to extend the useful lifetime of the device package.

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the invention. Only the claims that follow are meant to set bounds as to what the present invention includes.

What is claimed is:

1. A device package comprising:
an integrated cooling assembly comprising a semiconductor device and a cold plate bonded to the semiconductor device, the cold plate comprising a patterned first side and an opposite second side, wherein:
the patterned first side comprises a base surface, sidewalls, and a plurality of support features;
the base surface is spaced apart from the semiconductor device to collectively define a coolant channel therebetween;
the sidewalls slope away from the base surface at an angle greater than 90 degrees and are bonded to the semiconductor device to define a perimeter of the coolant channel;
the plurality of support features is bonded to the semiconductor device inward of the perimeter; and
each of the plurality of support features is wider at the base surface than at a bonding interface with the semiconductor device.

2. The device package of claim 1, wherein the cold plate is bonded to the semiconductor device by direct dielectric bonds.

3. The device package of claim 1, wherein the cold plate is bonded to the semiconductor device by direct hybrid bonds.

4. The device package of claim 1, wherein openings in the integrated cooling assembly extend between the patterned first side and the opposite second side of the cold plate.

5. The device package of claim 1, wherein openings in the integrated cooling assembly comprise gaps between the patterned first side of the cold plate and the semiconductor device.

6. The device package of claim 1, further comprising:
a package substrate having the integrated cooling assembly disposed thereon;
a package cover disposed on the package substrate and extending over the integrated cooling assembly, the package cover having an inlet opening and an outlet opening disposed therethrough; and
a material layer disposed between the package cover and the cold plate, wherein
the coolant channel is in fluid communication with the inlet opening and the outlet opening through respective openings disposed through the material layer.

7. The device package of claim 6, further comprising a coolant fluid disposed in the coolant channel.

8. The device package of claim 6, wherein the openings in the integrated cooling assembly comprise portions of a fluid path that further comprises the inlet and outlet openings, the openings disposed through the material layer, and the coolant channel.

9. The device package of claim 6, wherein the package cover comprises one or more coolant line attachment features.

10. The device package of claim 6, further comprising an underfill layer that at least partially encapsulates the integrated cooling assembly in regions outside of the coolant channel.

11. The device package of claim 6, wherein the material layer forms an impermeable barrier between the package cover and the cold plate.

12. The device package of claim 6, wherein side surfaces of the cold plate and the semiconductor device are substantially flush with one another.

13. The device package of claim 6, wherein:
the semiconductor device is a first semiconductor device and the integrated cooling assembly further comprises a plurality of second semiconductor devices vertically arranged in a device stack; and
the device stack is attached to the patterned first side of the cold plate in a side-by-side arrangement with the first semiconductor device.

14. The device package of claim 13, wherein the cold plate is attached to a second semiconductor device of the plurality of second semiconductor devices by direct dielectric bonds.

15. The device package of claim 13, wherein the cold plate is attached to a second semiconductor device of the plurality of second semiconductor devices by direct hybrid bonds.

16. The device package of claim 6, wherein the semiconductor device is a first semiconductor device and the device package further comprises:
a device stack electrically connected to the package substrate in a side-by-side arrangement with the integrated cooling assembly; and
a first TIM layer disposed between the device stack and the package cover.

17. The device package of claim 16, wherein the package cover comprises a thermally conductive metal that forms a portion of a heat transfer path between the device stack and the coolant channel.

18. The device package of claim 16, further comprising a heat sink thermally coupled to an outside surface of the package cover, wherein the package cover comprises a thermally conductive metal that forms a portion of a heat transfer path between the device stack and the heat sink.

19. The device package of claim 6, wherein:
the semiconductor device comprises a first device and a second device directly bonded to the first device;
the integrated cooling assembly comprises one or more cold plates attached to the first device; and
each of the one or more cold plates is sealed to the package cover by an adhesive layer to define perimeters of the coolant channels respectively disposed therebetween.

20. The device package of claim 19, wherein the second device is thermally coupled to the package cover by a TIM layer disposed therebetween.

21. The device package of claim 1, wherein the cold plate comprises sloped sidewalls are formed by a wet etch.

* * * * *